United States Patent
Marshall et al.

(10) Patent No.: US 11,778,743 B2
(45) Date of Patent: Oct. 3, 2023

(54) EXPANSION CARD WITH MEZZANINE LEVEL CONNECTOR

(71) Applicant: XILINX, INC., San Jose, CA (US)

(72) Inventors: Ieuan James Mackereth Marshall, Baldock (GB); Robert Andrew Daniels, March (GB)

(73) Assignee: XILINX, INC., San Jose, CA (US)

( * ) Notice: Subject to any disclaimer, the term of this patent is extended or adjusted under 35 U.S.C. 154(b) by 81 days.

(21) Appl. No.: 17/687,548

(22) Filed: Mar. 4, 2022

(65) Prior Publication Data

US 2023/0284384 A1 Sep. 7, 2023

(51) Int. Cl.
*H05K 1/14* (2006.01)
*H05K 1/02* (2006.01)

(52) U.S. Cl.
CPC ............ *H05K 1/14* (2013.01); *H05K 1/0274* (2013.01); *H05K 2201/0397* (2013.01); *H05K 2201/1034* (2013.01); *H05K 2201/10325* (2013.01)

(58) Field of Classification Search
CPC ................... H05K 1/14; H05K 1/0274; H05K 2201/0397; H05K 2201/10325; H05K 2201/1034
See application file for complete search history.

(56) References Cited

U.S. PATENT DOCUMENTS

| | | | | |
|---|---|---|---|---|
| 5,251,109 A * | 10/1993 | Baitz | .................... | H05K 7/1429 361/752 |
| 5,329,428 A * | 7/1994 | Block | ................ | H01R 12/7076 439/74 |
| 5,628,637 A * | 5/1997 | Pecone | .................... | G06F 1/184 439/74 |
| 5,959,847 A * | 9/1999 | McMillian | ............. | H05K 7/186 361/752 |
| 5,984,688 A | 11/1999 | Norris | | |
| 6,256,208 B1 * | 7/2001 | Supinski | ................. | G06F 1/186 361/759 |
| 6,295,565 B1 * | 9/2001 | Lee | ........................ | G06F 3/0689 710/2 |
| 7,746,654 B2 | 6/2010 | Franz et al. | | |
| 2003/0107872 A1 * | 6/2003 | Klimke | ................ | H05K 9/0016 361/800 |
| 2004/0201956 A1 * | 10/2004 | Conway | ................ | H05K 7/1461 361/679.41 |
| 2006/0221590 A1 * | 10/2006 | Campini | ................ | H05K 1/141 361/796 |
| 2006/0270251 A1 * | 11/2006 | Chen | ....................... | H05K 1/141 439/76.1 |
| 2020/0045843 A1 * | 2/2020 | Schramm | ................ | G06F 1/185 |

\* cited by examiner

*Primary Examiner* — Hoa C Nguyen
(74) *Attorney, Agent, or Firm* — Patterson + Sheridan, LLP

(57) ABSTRACT

An expansion card having a mezzanine level communication port is disclosed herein. The mezzanine level communication port frees space on the primary substrate (e.g., printed circuit board) for any one or more of a variety of expansion card components. The expansion card includes a bracket, a first communication port, a primary substrate, and a secondary substrate. The first communication port is coupled to the bracket. The primary and secondary substrates are disposed on one side of the bracket. The secondary substrate has a termination of the first communication port.

20 Claims, 3 Drawing Sheets

EXPANSION CARD WITH MEZZANINE LEVEL CONNECTOR

TECHNICAL FIELD

Embodiments of the present invention generally relate to an expansion card for interfacing with a computer motherboard, and in particular, to an expansion card having a secondary substrate for terminating a communication port separate from a primary substrate (e.g., the primary printed circuit board).

BACKGROUND

Computing systems, such as computers, control systems, automated teller machines, data centers, artificial intelligence systems, and machine learning systems among others, often employ one or more expansion cards connected to a computer's motherboard to add functionality to the computing system. Typically, expansion cards are removable such that specific functionality provided by the circuitry of the expansion card can be added as desired to the computing system.

One edge of the expansion card includes edge contacts that fit into a mating socket disposed on the motherboard of the computing system. The edge contacts electrically connect the functional circuitry of the expansion card with the electronics disposed on or otherwise coupled to the motherboard. Peripheral expansion cards may additionally have communication ports for accepting external cables. In most expansion cards, the communication ports are located on a support bracket that secures the expansion card to a housing of the computing system.

Certain expansion cards, such as PCIe network interface cards, have keep-out regions that limit the space available for connections between the printed circuit board of the expansion card and the communication ports formed through the mounting bracket upon which the printed circuit board is mounted. Thus, communication ports are typically mounted directly on the printed circuit board or utilize short pigtail connectors. When pigtail connectors are utilized, the printed circuit board must include an appropriate impedance matched connector mounted on the printed circuit board. The impedance matched connector generally consumes a significant area of the printed circuit board which the inventors have discovered could be more advantageously utilized for other components, such as heat sinks, integrated circuit dies or surface mounted circuit components.

Therefore, a need exists for an improved expansion card.

SUMMARY

An expansion card having a mezzanine level communication port is disclosed herein. The mezzanine level communication port frees space on the primary substrate (e.g., printed circuit board) of the expansion card for any one or more of a variety of expansion card components.

In one example, an expansion card is provided with a mezzanine level first communication port that also includes a bracket, a primary substrate, and a secondary substrate. The bracket has an elongated body extending between a first end and a second end. The elongated body has a first side and a second side facing away from the first side. The first communication port is coupled to the bracket and is configured to receive a complimentary connector from the second side of the bracket. The primary substrate is coupled to the second side of the elongated bracket in an orientation perpendicular to the second side. The primary substrate is a printed circuit board (PPCB) and has functional circuitry terminating at edge connectors configured to mate with a motherboard. The secondary substrate is disposed on the second side of the elongated bracket. The secondary substrate has a termination of the first communication port. The termination coupled to the functional circuitry of the PPCB.

In another example, an expansion card includes a bracket, a first communication port, a primary substrate, and a secondary substrate. The bracket has an elongated body extending between a first end and a second end. The elongated body has a first side and a second side facing away from the first side. The first communication port is coupled to the bracket and is configured to receive a complimentary connector from the second side of the bracket. The first communication port configured as an RF communication port. The primary substrate is coupled to the second side of the elongated bracket in an orientation perpendicular to the second side. The primary substrate is a printed circuit board having functional circuitry terminating at edge connectors configured to mate with a motherboard. The secondary substrate is disposed on the second side of the elongated bracket. The first communication port is mounted to the secondary substrate, and the secondary substrate has a termination of the first communication port. The termination is coupled to the functional circuitry of the printed circuit board.

In yet another example, an expansion card includes a bracket, a first communication port, a primary substrate, and a secondary substrate. The bracket has an elongated body extending between a first end and a second end. The elongated body has a first side and a second side facing away from the first side. The first communication port is coupled to the bracket and is configured to receive a complimentary connector from the second side of the bracket. The first communication port is configured as an RF communication port. The primary substrate is coupled to the second side of the elongated bracket in an orientation perpendicular to the second side. The primary substrate is a printed circuit board having functional circuitry terminating at edge connectors configured to mate with a motherboard. The functional circuitry is configured to provide network interface functionality. The secondary substrate is disposed on the second side of the elongated bracket. The first communication port is mounted to the secondary substrate. The secondary substrate has a termination of the first communication port that is coupled to the functional circuitry of the printed circuit board. The first communication port is surface mounted to the secondary substrate and bulkhead mounted to the bracket. The termination of the first communication port is configured to terminate a communication cable with an electrical impedance of 50, 75 or 100 ohms. A driver is also mounted to the secondary substrate and coupled to the first communication port. A second communication port and/or an indicator light is disposed between the secondary substrate and the printed circuit board.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Examples of expansion cards having a secondary substrate for terminating a communication port separate from a primary substrate (e.g., the primary printed circuit board of the expansion card) are disclosed herein. The secondary substrate is located offset from the primary substrate adjacent a bracket utilized to secure the expansion card in a computing system. The terminating the communication port on the secondary substrate frees space on the primary substrate for any one or more of a variety of expansion card components, such as heat sink components, additional ports, lights, surface mounted circuit elements, integrated circuit dies, optical components, cooling elements and the like. The extra space may be utilized to improve functionality, performance and cooling of the expansion card as needed.

Figure 1:
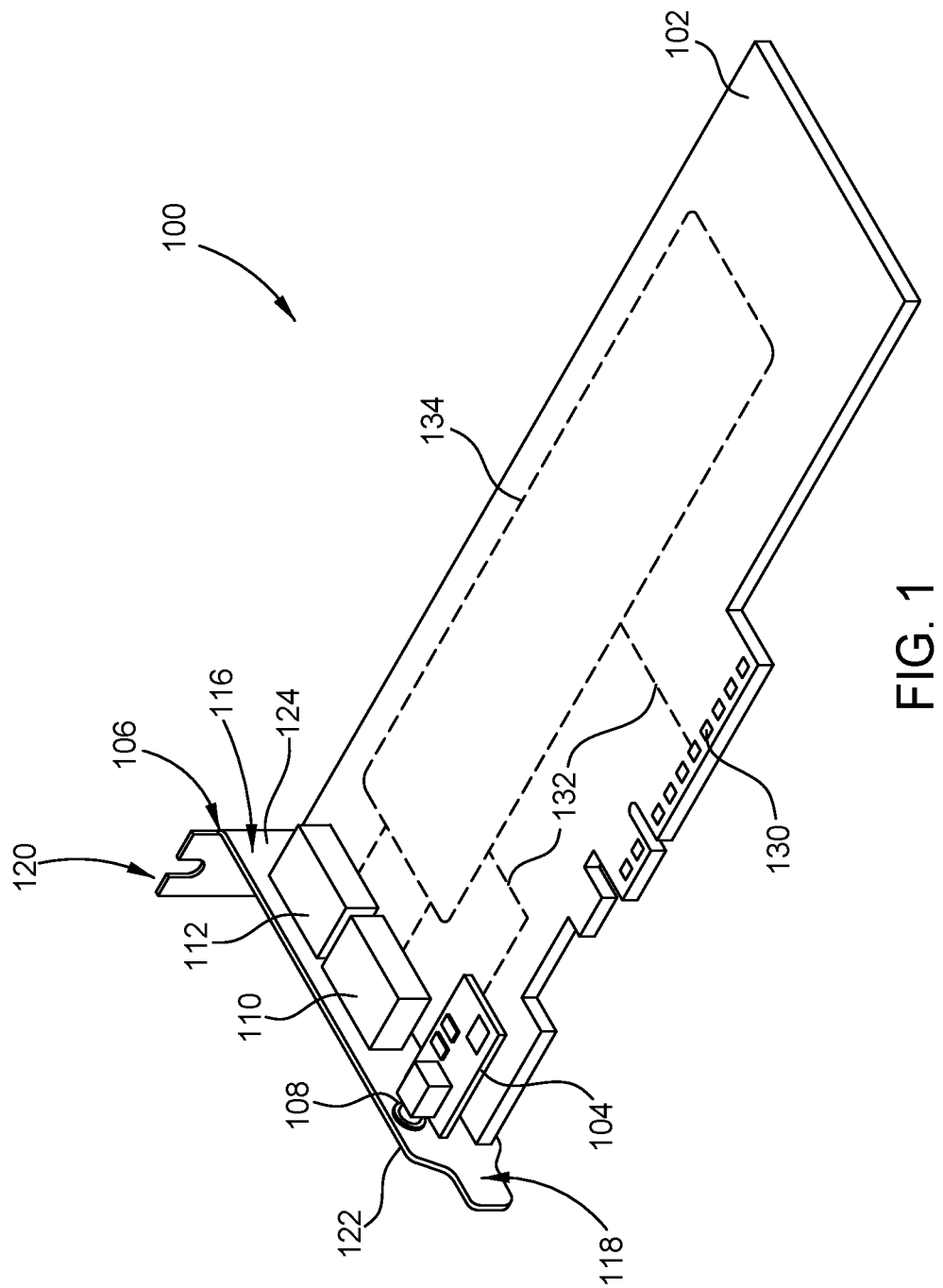
FIG. 1 is an isometric view of an expansion card having a secondary substrate for terminating a communication port separate from a primary substrate (e.g., the primary printed circuit board).

Turning now to FIG. 1, an isometric view of an exemplary expansion card 100 is shown. The expansion card 100 is configured to mate with an expansion slot disposed on a motherboard of a computing system. The expansion card 100 includes a primary substrate 102 (e.g., the primary printed circuit board), a secondary substrate 104 and a bracket 106. The primary substrate 102 and the secondary substrate 104 are coupled to the bracket 106. The primary substrate 102 and the secondary substrate 104 may be coupled to the bracket 106 by any suitable technique. In one example, the primary substrate 102 has an orientation that is substantially the same as the secondary substrate 104, for example, the primary substrate 102 and the secondary substrate 104 may have a substantially parallel orientation. Alternatively, the primary substrate 102 and the secondary substrate 104 may have a substantially perpendicular or other desired orientation. As utilized above, substantially indicates a tolerance of plus or minus 15 degrees.

A discussed above, the primary substrate 102 is a printed circuit board. The primary substrate 102 generally includes functional circuitry 134 coupled to edge contact pads 130 by traces 132. The primary substrate 102 may also include one or more other components, such as heat sinks, liquid cooling devices, antennas, electrical covers or other components not illustrated in FIG. 1. The functional circuitry 134 generally includes one or more integrated circuit dies and one or more surface mounted circuit components. The one or more integrated circuit dies may include one or more logic dies, one or more memory dies or combinations thereof. The surface mounted circuit components may include one or more resistors, one or more inductors one or more diodes or combinations thereof. The functional circuitry 134 is configured to provide the add functionality to the computing system to which the expansion card 100 is installed. The functional circuitry 134 may be configured to expand the sound capabilities of the computing system; allow the addition of multiple monitors; improve and/or speed graphics processing; enable multiple network connections; enable communication through more or more serial and/or parallel ports; enable communication through additional communication ports, such as USB ports; enable communication via Firewire (such as a IEEE 1394 interface connection), provide additional memory, enable wireless network communications, enable cellular communications, enable cable television communications, and/or capture video and/or still images. As such, the functional circuitry 134 enables the expansion card 100 to be configure as an audio card, a sound card, a video card (such as a graphics card or display card), a video card, a network interface card, a SSD expansion card, a storage controller cards, a redundant array of independent disks (RAID) controller card, a serial and parallel cards, a USB expansion card, a Firewire card (such as a IEEE 1394 interface connection), a storage card, a modem card, a wireless card, a cellular card, a TV tuner card, or a video capture card.

The functional circuitry 134 may also be coupled to at least one communication port. For example, the functional circuitry 134 is coupled to at least a first communication port 108, and optionally, one of more additional communication ports. In FIG. 1, the functional circuitry 134 is coupled to the first communication port 108, a second communication port 110 and a third communication port 112. The second and third communication ports 110, 112 are coupled to the primary substrate 102. In one example, the second and third communication ports 110, 112 are peripheral component interconnect express (PCIe) style connectors, for example an M.2 connectors. It is contemplated that the second and third communication ports 110, 112 may alternatively be another style connector. The second and third communication ports 110, 112 are accessible for connection to communication cables through the bracket 106.

The first communication port 108 is coupled to the secondary substrate 104 and/or the bracket 106. The first communication port 108 is separated from the primary substrate 102 by the secondary substrate 104. The first communication port 108 is coaxial RF connector or other suitable connector. In one example, the first communication port 108 is a subminiature style connector, such as a SMA, SMB, SSMB or other suitable subminiature RF connector. The first communication port 108 is accessible for connection to a communication cable through the bracket 106. In the embodiment depicted in FIG. 1, the first communication port 108 is coupled to both the secondary substrate 104 and the bracket 106.

The bracket 106 is generally fabricated from a conductive material, such as a metal. In one example, the bracket 106 is fabricated from stainless steel or nickel plated carbon steel. The bracket 106 includes an elongated flat body 116. The body 116 has a tab (first) end 118 and a fastener (second) end 120. The tab end 118 is generally narrower than main portion of the body 116, and may include a taper for engaging and locating the expansion card 100 in a housing of the computing system. The tab end 118 of the body 116 generally forms a right angle with a front side 122 of the body 116. The tab end 118 includes one or more slots or holes for securing the bracket 106, and thus the expansion card 100, to the computing system.

Figure 2:
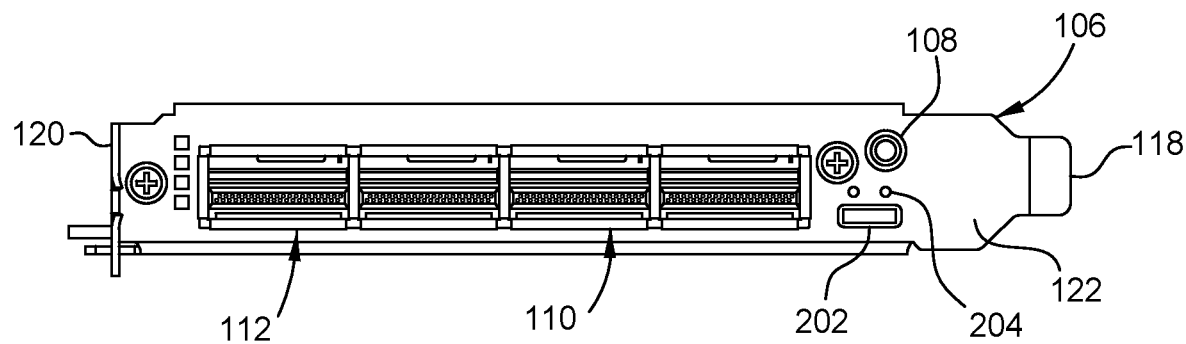
FIG. 2 is a front view of the expansion card of FIG. 1.

FIG. 2 is a front view of the expansion card 100. The body 116 of the bracket 106 of the expansion card 100 includes a number of apertures, such as for lights, venting, fasteners, and for the communication ports 108, 110, 112. The communication ports 108, 110, 112 generally extend through the body 116, or are accessible from the front side 122 of the bracket 106. Also extending through or accessible from the front side 122 of the body 116 of the bracket 106 is a fourth port 202 and/or one or more signal lights 204. The fourth port 202 may be a communication port and/or a power port. In one example, the fourth port 202 is a USB port, such as a USB-A port, USB-B port, a USB-B Mini port, a USB-B Micro port, a USB-C port, a USB-Lightning port or other suitable USB port. In example, the fourth port 202 is a different type of power and/or communication port. The fourth port 202 is coupled to the primary substrate 102, and is coupled to the functional circuitry 134 disposed on the primary substrate 102 by the traces 132 formed on the primary substrate 102.

The one or more signal lights 204 are visible through the bracket 106. The one or more signal lights 204 may be coupled to the functional circuitry 134 disposed on the primary substrate 102 by the traces 132 formed on the primary substrate 102. Alternatively, the one or more signal lights 204 may be coupled to one or more of the circuit components formed on or coupled to the secondary substrate 104.

Returning back to FIG. 1, the primary substrate 102 and the secondary substrate 104 are coupled to the back side 124 of the bracket 106. The primary substrate 102 and the secondary substrate 104 generally have a planar orientation that is substantially perpendicular to a planar orientation of the front and back sides 122, 124 of the body 116 of the bracket 106. The secondary substrate 104 has a planar area that is less than a tenth of the planar area of the primary substrate 102.

Figure 3:
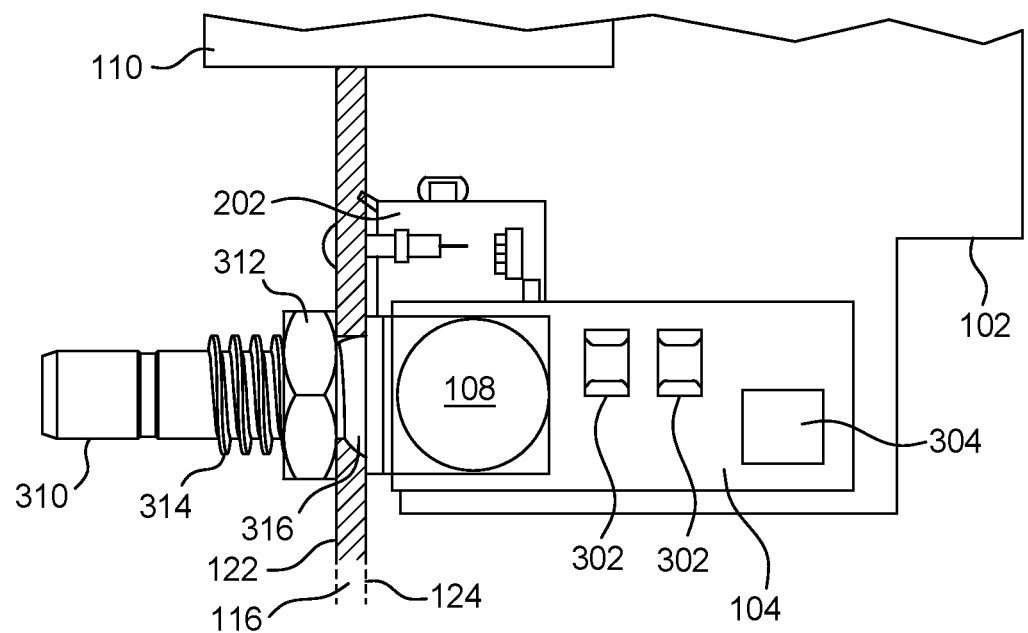
FIG. 3 is a top view of a portion of the expansion card of FIG. 1.

FIG. 3 is a top view of a portion of the expansion card 100 illustrating the secondary substrate 104 disposed over the primary substrate 102. The fourth port 202, for example a USB port, is shown with a portion sticking out from between the primary and secondary substrates 102, 104. As described above, the area between the primary and secondary substrates 102, 104 provides room for the fourth port 202, one or more signal lights 204, and/or other devices, circuits or components of the expansion card 100 in the space defined between the primary and secondary substrates 102, 104. For example, the space below the secondary substrate 104 frees up space on the primary substrate 102 for any one or more of a variety of expansion card components, such as heat sink components, additional ports, lights, surface mounted circuit elements, integrated circuit dies, optical components, cooling elements and the like.

The secondary substrate 104 generally provides a surface for interfacing the first communication port 108 with the primary substrate 102. In one example, the secondary substrate 104 is a printed circuit board that enables the first communication port 108 to be surface mounted thereto. In other examples, the first communication port 108 may be mounted to the secondary substrate 104 in utilizing an alternative technique. In still other examples, the first communication port 108 is mounted to bracket 106, but only electrically connected the secondary substrate 104 to provide an interface to communicating with the functional circuitry 134 of the primary substrate 102.

The secondary substrate 104 also includes a termination for the first communication port 108. For example, the termination for the first communication port 108 may be in the form of one or more circuit elements 302 that are surface mounted to the secondary substrate 104. The one or more circuit elements 302 are selected to match the characteristic impedance of the transmission line that is to be mated with the first communication port 108 during operation of the computing system to which the expansion card 100 is connected. The one or more circuit elements 302 may be in the form of one or more resistors, such that the total resistance is 50 ohm, 75 ohm, 100 ohm or other desired resistance.

The secondary substrate 104 may optionally include a driver 304 coupled to the first communication port 108. The driver 304 conditions signals from the primary substrate 102 for transmission through first communication port 108 to the transmission line mated with the first communication port 108. In the example depicted in FIG. 3, the driver 304 is surface mounted to the secondary substrate 104, although other techniques for securing the driver 304 to the secondary substrate 104 may be utilized.

The first communication port 108 is generally coupled to at least one of the secondary substrate 104 and/or the bracket 106. In one example, the first communication port 108 is in the form of a bulkhead connector. The first communication port 108 generally includes a female receptacle 310 that extends through a hole 316 formed through the body 116 of the bracket 106. A threaded region 314 is disposed behind the female receptacle 310 of the first communication port 108. The threaded region 314 of the first communication port 108 is small enough to pass through hole 316 formed through the bracket 106 such that a nut 312 can be engaged with threaded region 314 after passing through the hole 316. Tightening the nut 312 against the front side 122 of the bracket 106 pulls a body 318 of the first communication port 108 against the back side 124 of the bracket 106, thus securing the first communication port 108 to the bracket 106 and the expansion card 100. Additionally, in examples where the body 318 of the first communication port 108 is surface mounted to the secondary substrate 104, the bulkhead connection of the first communication port 108 to the bracket 106 also secures the secondary substrate 104 to the bracket 106. Details of how the first communication port 108 is coupled to the bracket 106 are further described below with reference to FIGS. 4 and 5.

Figure 4:
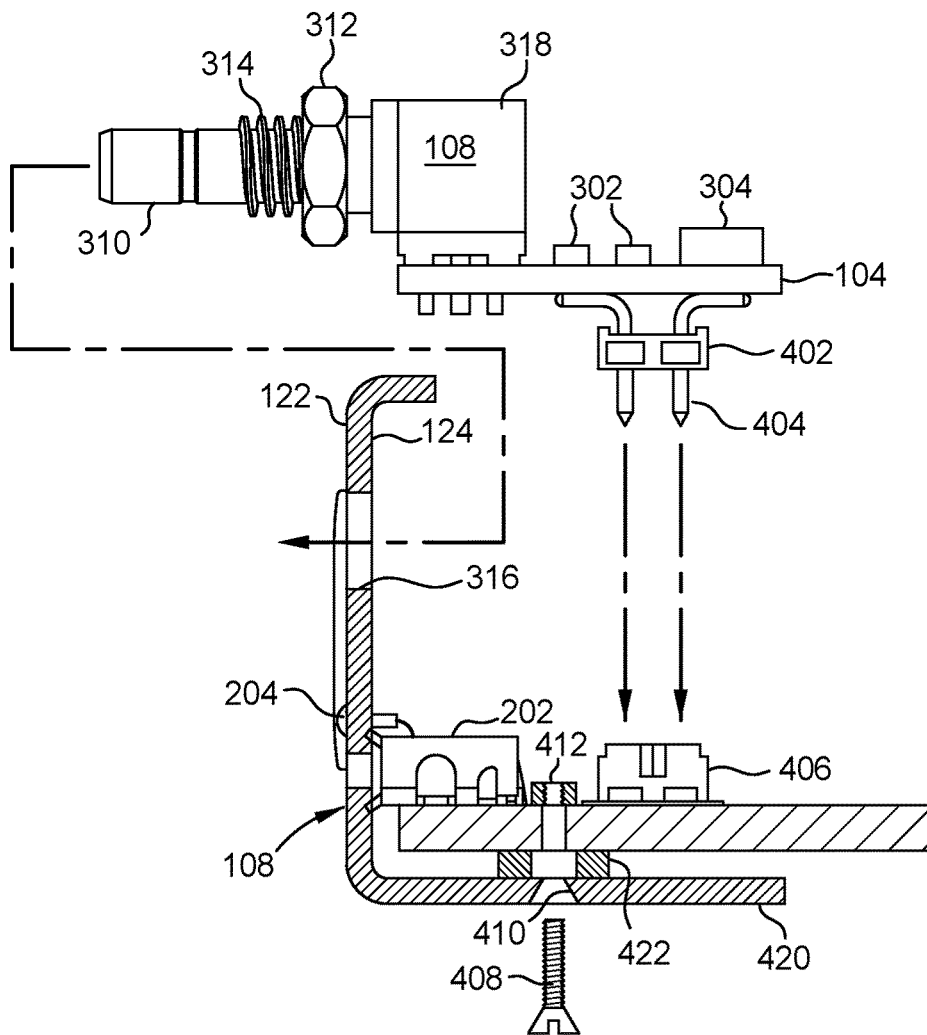
FIG. 4 is a partial exploded side view of a portion of the expansion card of FIG. 1.
Figure 5:
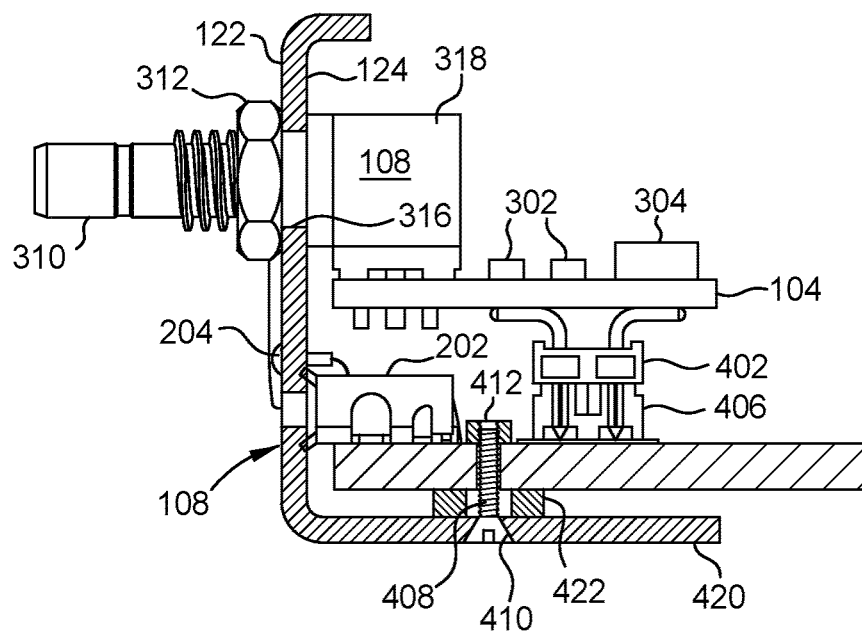
FIG. 5 is a sectional view of a portion of the expansion card of FIG. 1.

FIG. 4 is a partial exploded side view of a portion of the expansion card 100, illustrating the primary substrate 102, the secondary substrate 104 and the bracket 106 separated prior to assembly. FIG. 5 is a partial side view of a portion of the expansion card 100, after the primary substrate 102, the secondary substrate 104 and the bracket 106 have been assembled.

Referring jointly to FIGS. 4 and 5, the terminations (e.g., the circuit elements 302, and driver 304, when present) are coupled through the secondary substrate 104 to a connector 402. The connector 402 disposed on the bottom of the secondary substrate 104 is configured to mate with a complimentary connector 406 mounted on an upper surface the primary substrate 102 that faces the secondary substrate 104. As the impedance matching requirement of the first communication port 108 is already satisfied by circuit elements 302 on board the secondary substrate 104, the connectors 402, 406 do not have any impedance matching requirement across the electrical connection between the primary and secondary substrates 102, 104, thus allowing for a wide array of connectors 402, 406 and connector locations to be utilized. In one example, the connector 402 is a 2 mm male header having pins 404 extending therefrom which engage a female receptacles of the complimentary connector 406 mounted on the primary substrate 102.

The connectors 402, 406, once mated, also help support the secondary substrate 104 above the primary substrate 102. However, the bulkhead connection of the first communication port 108 to the bracket 106 provides the primary cantilevered support of the secondary substrate 104 above the primary substrate 102. Additionally, since the secondary substrate 104 is a small fraction of the size of the primary substrate 102, the bulkhead connection between the first communication port 108 and the bracket 106 provides sufficient mechanical strength to robustly support the secondary substrate 104 above the primary substrate 102 without need for additional structural support components whose primary purpose would be to support the secondary substrate 104. Of course, standoffs or other brackets and the like may be optionally utilized to secure the secondary substrate 104 above the primary substrate 102.

The primary substrate 102 may be coupled to the bracket 106 utilizing any suitable technique. In the example depicted in FIGS. 4 and 5, the bracket 106 includes a flange 420 that extends at a right angle away from the second side 124 of the bracket 106. The flange 420 provides a mounting surface upon which the primary substrate 102 may be secured. For example, the flange 420 may include a mounting hole 410 that receives a fastener 408 that is threadingly engaged with a nut 412 surface mounted to the primary substrate 102. By tightening the fastener 408, the primary substrate 102 is pulled securely against the flange 420 of the bracket 106. A spacer 422 may optionally be used between the primary substrate 102 and the flange 420 to space the primary substrate 102 from the bracket 106, for example, to prevent inadvertent shorting of the traces 132 or the functional circuitry 134 disposed on the primary substrate 102 to the bracket 106.

Thus, an expansion card has been provided that utilizes a mezzanine level communication port. The mezzanine level communication port free up space on the primary substrate (e.g., printed circuit board) for any one or more of a variety of expansion card components, such as heat sink components, additional ports, lights, surface mounted circuit elements, integrated circuit dies, optical components, cooling elements and the like. Thus, greater design latitude and flexibility are provided that enables improved functionality and performance of the expansion card.

While the foregoing is directed to embodiments of the present invention, other and further embodiments of the invention may be devised without departing from the basic scope thereof, and the scope thereof is determined by the claims that follow.

What is claimed is:

1. An expansion card comprising:
   a bracket having an elongated body extending between a first end and a second end, the elongated body having a first side and a second side facing away from the first side;
   a first communication port coupled to the bracket and configured to receive a complimentary connector from the second side of the bracket;
   a primary substrate coupled to the second side of the bracket in an orientation perpendicular to the second side, wherein the primary substrate is a printed circuit board (PPCB), the PPCB having functional circuitry terminating at edge connectors configured to mate with a motherboard; and
   a secondary substrate disposed on the second side of the bracket, the secondary substrate having a termination of the first communication port, the termination coupled to the functional circuitry of the PPCB.

2. The expansion card of claim 1, wherein the secondary substrate and the PPCB have a substantially similar orientation.

3. The expansion card of claim 1, wherein the orientation of the PPCB is the same as an orientation of the secondary substrate.

4. The expansion card of claim 1, wherein the termination of the first communication port is configured to match an impedance of a communication cable configured to couple to the PPCB through the first communication port.

5. The expansion card of claim 4, wherein the termination of the first communication port is configured to terminate a communication cable with an electrical impedance of 50, 75 or 100 ohms.

6. The expansion card of claim 1, wherein the termination of the first communication port further comprises:
   one or more resistors surface mounted to the secondary substrate.

7. The expansion card of claim 1, wherein the secondary substrate further comprises:
   a driver coupled to the first communication port.

8. The expansion card of claim 1 further comprises:
   a second communication port disposed between the secondary substrate and the PPCB.

9. The expansion card of claim 1 further comprises:
   an indicator light disposed between the secondary substrate and the PPCB.

10. The expansion card of claim 1 further comprises:
    a male/female connector disposed between the secondary substrate and the PPCB, the male/female connector coupling the termination of the first communication port and the functional circuitry of the PPCB.

11. The expansion card of claim 1, wherein the functional circuitry of the PPCB is selected from an audio card, a sound card, a video card (such as a graphics card or display card), a video card, a network interface card, a serial and parallel cards, a USB expansion card, a Firewire card (such as a IEEE 1394 interface connection), a storage card, a modem card, a wireless card, a cellular card, a TV tuner card, and a video capture card.

12. The expansion card of claim 1, wherein the secondary substrate is a printed circuit board.

13. An expansion card comprising:
    a bracket having an elongated body extending between a first end and a second end, the elongated body having a first side and a second side facing away from the first side;
    a first communication port coupled to the bracket and configured to receive a complimentary connector from the second side of the bracket, the first communication port configured as an RF communication port;
    a primary substrate coupled to the second side of the bracket in an orientation perpendicular to the second side, wherein the primary substrate is a printed circuit board (PPCB), the PPCB having functional circuitry terminating at edge connectors configured to mate with a motherboard; and
    a secondary substrate disposed on the second side of the bracket, the first communication port mounted to the secondary substrate, the secondary substrate having a termination of the first communication port, the termination coupled to the functional circuitry of the PPCB.

14. The expansion card of claim 13, wherein the first communication port is surface mounted to the secondary substrate.

15. The expansion card of claim 13, wherein the first communication port is bulkhead mounted to the bracket.

16. The expansion card of claim 13, wherein the termination of the first communication port is configured to terminate a communication cable having a resistance of 50, 75 or 100 ohms.

17. The expansion card of claim 13, wherein the secondary substrate further comprises:
a driver coupled to the first communication port.

18. The expansion card of claim 13 further comprises:
a second communication port and/or an indicator light disposed between the secondary substrate and the PPCB.

19. The expansion card of claim 13, wherein the functional circuitry of the PPCB is selected from an audio card, a sound card, a video card (such as a graphics card or display card), a video card, a network interface card, a serial and parallel cards, a USB expansion card, a Firewire card (such as a IEEE 1394 interface connection), a storage card, a modem card, a wireless card, a cellular card, a TV tuner card, and a video capture card.

20. An expansion card comprising:
a bracket having an elongated body extending between a first end and a second end, the elongated body having a first side and a second side facing away from the first side;
a first communication port coupled to the bracket and configured to receive a complimentary connector from the second side of the bracket, the first communication port configured as an RF communication port;
a primary substrate coupled to the second side of the bracket in an orientation perpendicular to the second side, wherein the primary substrate is a printed circuit board (PPCB), the PPCB having functional circuitry terminating at edge connectors configured to mate with a motherboard, the functional circuitry configured to provide network interface functionality;
a secondary substrate disposed on the second side of the bracket, the first communication port mounted to the secondary substrate, the secondary substrate having a termination of the first communication port, the termination coupled to the functional circuitry of the PPCB, wherein the first communication port is surface mounted to the secondary substrate and bulkhead mounted to the bracket, wherein the termination of the first communication port is configured to terminate a communication cable having a resistance of 50, 75 or 100 ohms;
a driver mounted to the secondary substrate and coupled to the first communication port; and
a second communication port and/or an indicator light disposed between the secondary substrate and the PPCB.

* * * * *